(12) United States Patent
Nishijima et al.

(10) Patent No.: US 7,476,918 B2
(45) Date of Patent: Jan. 13, 2009

(54) SEMICONDUCTOR INTEGRATED CIRCUIT DEVICE AND VEHICLE-MOUNTED RADAR SYSTEM USING THE SAME

(75) Inventors: Masaaki Nishijima, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 216 days.

(21) Appl. No.: 11/284,049

(22) Filed: Nov. 22, 2005

(65) Prior Publication Data

US 2006/0226415 A1   Oct. 12, 2006

(30) Foreign Application Priority Data

Nov. 22, 2004   (JP) .............................. 2004-337112

(51) Int. Cl.
*H01L 29/08* (2006.01)
(52) U.S. Cl. .................. 257/276; 257/192; 257/194; 257/275; 257/E29.246; 257/E29.247; 257/E29.248; 257/E29.249; 257/E29.252
(58) Field of Classification Search .............. 257/11, 257/275, 192, 194, 276, 277, E29.246–249, 257/E29.252
See application file for complete search history.

(56) References Cited

U.S. PATENT DOCUMENTS

2002/0130389 A1* 9/2002 Arimochi et al. ............. 257/532
2004/0056253 A1* 3/2004 Honda ......................... 257/72
2005/0012123 A1* 1/2005 Adachi ........................ 257/276
2007/0026676 A1* 2/2007 Li et al. ....................... 438/689

FOREIGN PATENT DOCUMENTS

| JP | 05-243843 | 9/1993 |
|---|---|---|
| JP | 08-512432 | 12/1996 |
| JP | 11-500268 | 1/1999 |
| WO | WO 95/02892 | 1/1995 |
| WO | WO 96/25765 | 8/1996 |

OTHER PUBLICATIONS

Green et al., High-Power Broad-Band AlGaN/GaN HEMT MMICs on SiC Substrates, IEEE Transactions on Microwave Theory and Techniques, vol. 49, p. 2486-2493, 2001.*
Khan et al.; "High Electron Mobility Transistor Based on a GaN-$Al_xGa_{1-x}N$ Heterojunction"; *Applied Physics Letters*; c. 1993; American Institute of Physics; pp. 1214-1215.

* cited by examiner

*Primary Examiner*—Minh-Loan T Tran
*Assistant Examiner*—Minchul Yang
(74) *Attorney, Agent, or Firm*—McDermott Will & Emery LLP

(57) ABSTRACT

A semiconductor integrated circuit device includes a HFET formed on part of a substrate made of sapphire and including a Group III-V nitride semiconductor layer, a dielectric film formed on the substrate to cover the top and side surfaces and upper corners of the Group III-V nitride semiconductor layer, a microstrip line formed with the dielectric film interposed between the substrate and the microstrip line, and a drain lead which is formed on part of the dielectric film and through which the HFET is electrically connected to the microstrip line.

16 Claims, 7 Drawing Sheets

53, 56

51, 58

57

SEMICONDUCTOR INTEGRATED CIRCUIT DEVICE AND VEHICLE-MOUNTED RADAR SYSTEM USING THE SAME

CROSS-REFERENCE TO RELATED APPLICATIONS

The disclosure of Japanese Patent Application No. 2004-337112 filed on Nov. 22, 2004 and Japanese Patent Application No. 2005-336104 filed on Nov. 21, 2005 including specification, drawings and claims is incorporated herein by reference in its entirety.

BACKGROUND OF THE INVENTION (1) Field of the Invention

The present invention relates to a semiconductor integrated circuit device and a vehicle-mounted radar system using the same, and more particularly relates to a monolithic microwave integrated circuit (MMIC) device in which an active circuit and a passive circuit are monolithically integrated.

(2) Description of Related Art

High-frequency parts used for mobile communication systems typified by cellular phones or vehicle-mounted radar systems have been demanded to have improved performance and a reduced size.

Conventionally, field-effect transistors (FETs) or heterostructure field-effect transistors (HFETs) both made of gallium arsenide (GaAs) have been used as electronic devices having high-output characteristics, low-noise characteristics and high-gain characteristics.

In recent years, attention has been paid to devices using an unconventional material of gallium nitride (GaN), as devices that can be expected to operate at a higher output, a higher frequency and a higher temperature than the devices using GaAs. GaN has a large band gap of 3.39 eV, and the dielectric breakdown voltage of GaN is about one order larger than that of GaAs. This increases the saturation drift velocity for electrons. Since M. Asif Khan et al. realized electronic devices using AlGaN/GaN-based compound semiconductor, the development of GaN-based devices has been advanced (see, for example, M. Asif Khan, "High electron mobility transistor based on a GaN—$Al_xGa_{1-x}N$ heterojunction (Appl. Phys. Lett., 63(9), 30 (1993), pp. 1214-1215).

In view of the previously-mentioned characteristics, GaN-based devices are promising as basic devices forming RF front-end sections of radio communication systems or radar systems. As previously mentioned, GaN-based devices using GaN having a large band gap exhibit high-breakdown-voltage characteristics. Therefore, it becomes unnecessary for each of GaN-based low-noise devices forming a reception circuit to have an input protection circuit that has been required to cope with an external surge, resulting in the reduced insertion loss of the protection circuit. As a result, the noise figure can be reduced. Furthermore, input power can be set high such that an interference wave produced at the output side with increase in an input signal becomes ignorable and the voltage of the input power does not exceed the breakdown voltage of the GaN-based low-noise device. Therefore, GaN-based low-noise devices also exhibit low-distortion characteristics.

GaN-based high-output devices forming transmitting circuits have high saturated output power and a high linearity of input-output characteristics between input power and output power. As seen from the above characteristics, mixers used as frequency converters or switches used as signal switches also exhibit low-loss and low-distortion characteristics.

As seen from the above, the GaN-based devices have a high sensitivity to weak input signals and low distortion characteristics even with high input power and are useful as devices that can deal with signals having a wide dynamic range.

By the way, a Group III-V nitride semiconductor layer made of GaN is epitaxially grown on a substrate made of sapphire (monocrystalline $Al_2O_3$) or silicon carbide (SiC) by vapor-phase epitaxy (VPE) such as metal organic vapor phase epitaxy (MOVPE) or molecular beam epitaxy (MBE).

A known GaN-based device will be described hereinafter.

It is typical that in the GaN-based device, a passive circuit, such as an inductor or a capacitor, is formed on an isolation region obtained by insulating part of a conductive layer located around an active element, such as a transistor, or formed with a dielectric film of silicon nitride (SiN) or the like interposed between the passive circuit and the isolation region (see, for example, the above paper).

Furthermore, as shown in FIG. 7, a monolithic microwave integrated circuit of a first known example in which an active element, such as a GaN-based transistor, and a passive circuit, such as a matching circuit or a bias circuit including an inductor, a capacitor, a resistor element, or a distributed-constant circuit, are integrated on a single substrate takes on a structure in which an isolation region 110 forming an insulated compound layer formed by ion implantation or the like is formed between the passive circuit and, for example, an insulative sapphire substrate 101.

To be specific, in the known GaN-based device, a GaN-based semiconductor layer 105 including a buffer layer 102 made of undoped AlN, a channel layer 103 made of undoped GaN and a carrier supplying layer 104 made of n-type AlGaN is formed on the principal surface of a sapphire substrate 101 by MOVPE. A gate electrode 106 is partly formed on the GaN-based semiconductor layer 105, and a source electrode 107 and a drain electrode 108 are formed on parts of the GaN-based semiconductor layer 105 located to both sides of the gate electrode 106, respectively, thereby forming a HFET 109.

An isolation region 110 is formed in the side portion of the GaN-based semiconductor layer 105 located to the drain electrode 108 side by implanting, for example, boron ions thereinto. An insulating film 111, for example, made of silicon nitride is formed on the GaN-based semiconductor layer 105 and the isolation region 110 to cover the gate electrode 106, the source electrode 107 and the drain electrode 108.

Furthermore, a conductive film 112 is entirely formed on the (back) surface of the sapphire substrate 101 opposite to the GaN-based semiconductor layer 105.

An interconnect 115 connected at one end to the source electrode 107 to pass through a first through hole 113 and at the other end to the conductive film 112 to pass through a second through hole 114 and a microstrip line 117 connected at one end to the drain electrode 108 to pass through a third through hole 116 are formed on part of the insulating film 111. In this case, the microstrip line 117 uses the conductive film 112 formed on the back surface of the sapphire substrate 101 as a ground line. The first and third through holes 113 and 116 pass through the insulating film 111, and the second through hole 114 passes through the insulating film 111, the GaN-based semiconductor layer 105 and the sapphire substrate 101.

FIG. 8 shows a GaAs-based MMIC of a second known example including a transistor section 5a, a capacitor section 5b and an antenna pattern all formed on a sapphire substrate 1, and an interconnect 4 through which they are connected to one another (see, for example, Japanese Unexamined Patent Publication No. 5-243843). At least one of the antenna pattern and the interconnect 4 is formed of an oxide high-temperature superconductor. Each of the sides of the transistor section 5a and the capacitor section 5b is partly covered with silicon oxide 6, and normal interconnects that are not made of a superconductor are formed to extend from part of the principal surface of the sapphire substrate 1 located in the transistor and capacitor sections 5a and 5b to part of the top surface of a conductive n-type GaAs layer 3b.

However, the GaN-based MMIC of the first known example shown in FIG. 7 using, for example, a microstrip line 117 for a passive circuit has the following problems. It is difficult that when an isolation region 110 is formed by insulating part of a GaN-based semiconductor layer 105 by ion implantation, its resistance is uniformly increased also for its region located in the vicinity of the upper part of a sapphire substrate 101. When a passive circuit is formed immediately above the isolation region 110 whose resistance is not uniformly increased, this makes the high-frequency loss larger as compared with the case where a passive circuit is formed on a uniformly insulated substrate. Furthermore, when the insulation performance of a substrate that determines high-frequency characteristics is not uniform, this reduces the permittivity of the substrate as compared with the case where a substrate is uniformly insulated. The reduction in the permittivity of the substrate increases the physical length of the microstrip line 117 required to achieve a desired electric length. As a result, the area of an MMIC chip is increased, leading to problems in downscaling the chip. The increase in the area of the chip becomes one of factors responsible for the increased cost.

Since in the GaAs-based MMIC of the second known example shown in FIG. 8 an interconnect is formed directly on a conductive layer (a silicon layer 3a or an n-type GaAs layer 3b), a dielectric loss due to the conductive layer and a high-frequency loss due to an impedance mismatch are caused in the interconnect serving as a high-frequency transmission line.

Moreover, since the interconnect is formed directly on the top surface of the conductive layer and some of the side surfaces thereof, the interconnect is likely to be partly removed at the corner (bend) of the conductive layer in the formation of the interconnect.

SUMMARY OF THE INVENTION

The present invention is made in view of the above conventional problems, and its object is to provide a semiconductor integrated circuit device which includes an active circuit and a passive circuit and while permitting reduction in the chip area, can reduce the high-frequency loss and prevent an interconnect from being partly removed at the bend.

In order to achieve the above object, a semiconductor integrated circuit device of the present invention is configured such that the top and side surfaces and upper corners of a nitride semiconductor layer forming part of an active circuit formed on part of an insulative substrate.

More specifically, a semiconductor integrated circuit device of the present invention comprises: an insulative substrate; an active circuit formed on part of the substrate and including a Group III-V nitride semiconductor layer; a dielectric film formed on the substrate to cover the top and side surfaces and upper corners of the Group III-V nitride semiconductor layer; a passive circuit formed with the dielectric film between the substrate and the passive circuit; and a first interconnect through which the active circuit and the passive circuit are electrically connected to each other, said first interconnect being formed on the dielectric film.

According to the semiconductor integrated circuit device of the present invention, since the Group III-V nitride semiconductor layer forming the active circuit is formed on part of the insulative substrate, this eliminates the need for forming an isolation region in a nitride semiconductor layer having conductivity. This can reduce the chip area without resistance variations, for example, in the increase of the resistance of the nitride semiconductor layer for the formation of the isolation region using ion implantation. Furthermore, since the passive circuit is formed with the dielectric film interposed between the substrate and the passive circuit, this can suppress the loss of an RF signal due to an interconnect. Moreover, since the first interconnect is formed on the dielectric film formed to cover the top and side surfaces and upper corners of the Group III-V nitride semiconductor layer, the first interconnect can be prevented from being partly removed.

In the semiconductor integrated circuit device of the present invention, the dielectric film is preferably a film formed by spin coating. Therefore, the dielectric film can be formed on the entire surfaces of the semiconductor layer including the upper corners thereof with reliability.

In this case, the film formed by spin coating is preferably made of benzocyclobutene (BCB), silicon oxide, silicon nitride, or silicon oxynitride.

Furthermore, in the semiconductor integrated circuit device of the present invention, the dielectric film is preferably made of silicon oxide or silicon nitride.

It is preferable that the semiconductor integrated circuit device of the present invention further comprises: a conductive film formed on the surface of the substrate opposite to the passive circuit; and a second interconnect through which the passive circuit and the conductive film are electrically connected to each other, said second interconnect being formed to pass through the substrate. This allows continuity through the second interconnect between the passive circuit and the conductive film formed on the back surface of the substrate. Therefore, the parasitic inductance due to an interconnect can be minimized.

It is preferable that the semiconductor integrated circuit device of the present invention filer comprises a bump formed on part of the dielectric film and electrically connected to the passive circuit. This can provide a so-called flip-chip packaging in which the active circuit and the passive circuit are opposed to each other on a mounting member for packaging. This eliminates the need for electrically connecting the active circuit to the passive circuit by wire bonding. Therefore, the use of flip-chip packaging can reduce the chip area and also the high frequency loss caused by bonding wires.

In the semiconductor integrated circuit device of the present invention, the passive circuit is preferably a capacitor, an inductor or a resistor element.

In the semiconductor integrated circuit device of the present invention, the passive circuit is preferably a microstrip line or a coplanar stripline.

In the semiconductor integrated circuit device of the present invention, the substrate is preferably made of sapphire, silicon carbide, gallium nitride, or high-resistivity silicon.

A vehicle-mounted radar system comprises an RF front-end section in which the semiconductor integrated circuit device of the present invention is used.

BRIEF DESCRIPTION OF THE DRAWINGS

FIGS. 1A and 1B show a semiconductor integrated circuit device (MMIC) according to a first embodiment of the present invention, of which FIG. 1A is a plan view of the semiconductor integrated circuit device and FIG. 1B is a cross-sectional view taken along the line Ib-Ib in FIG. 1A.

FIGS. 2A and 2B are enlarged views showing a part of the semiconductor integrated circuit device according to the first embodiment of the present invention located in the vicinity of one of bends of a dielectric film, of which FIG. 2A is a cross-sectional view showing the part of the dielectric film when the dielectric film is formed by CVD and FIG. 2B is a cross-sectional view showing the part of the dielectric film when the dielectric film is formed by spin coating.

FIGS. 3A and 3B show a semiconductor integrated circuit device (MMIC) according to a modification of the first embodiment of the present invention, of which FIG. 3A is a plan view of the semiconductor integrated circuit device and FIG. 3B is a cross-sectional view taken along the line IIIb-IIIb in FIG. 3A.

FIGS. 4A and 4B show a semiconductor integrated circuit device (MMIC) according to a second embodiment of the present invention, of which FIG. 4A is a plan view of the semiconductor integrated circuit device and FIG. 4B is a cross-sectional view taken along the line IVb-IVb in FIG. 4A.

FIGS. 6A through 6C show equivalent circuits of a plurality of MMICs used for the RF front-end section in FIG. 5, of which FIG. 6A is a diagram showing an equivalent circuit of a power amplifier or a low-noise amplifier, FIG. 6B is a diagram showing an equivalent circuit of an oscillator and FIG. 6C is a diagram showing an equivalent circuit of a down mixer.

DETAILED DESCRIPTION OF THE INVENTION

Embodiment 1

A first embodiment of the present invention will be described with reference to the drawings.

Figure 1A:
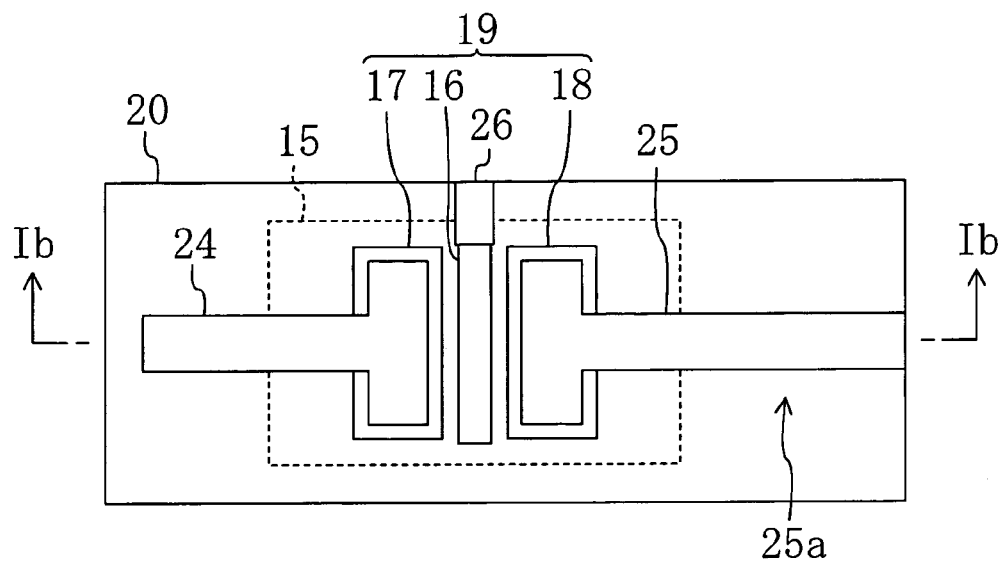
Figure 1B:
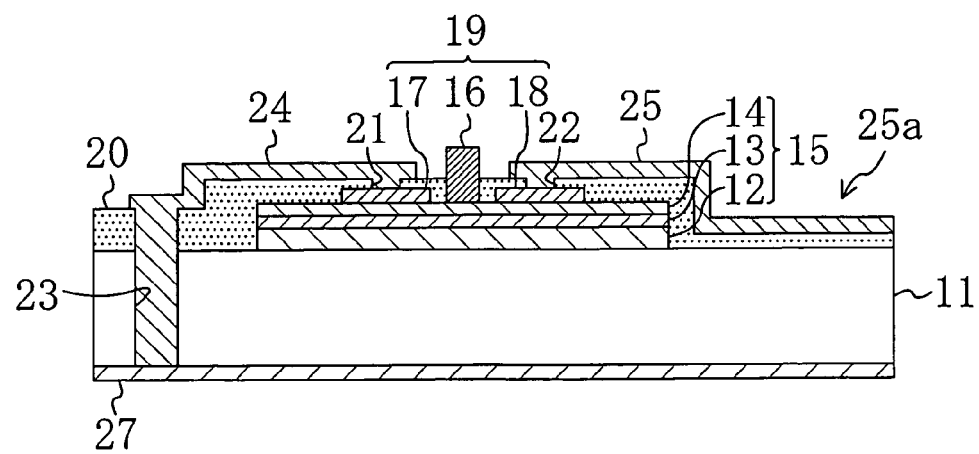

FIGS. 1A and 1B show a semiconductor integrated circuit device according to the first embodiment of the present invention. FIG. 1A is a plan view of a microwave or millimeter-wave MMIC including a GaN-based HFET serving as an active circuit and a microstrip line serving as a passive circuit. FIG. 1B is a cross-sectional view taken along the line 1b-1b in FIG. 1A. The structure of the MMIC and a fabrication method for the MMIC will be described hereinafter.

First, a 0.5-μm-thick buffer layer 12 made of undoped aluminum nitride (AlN), a 3-μm-thick channel layer 13 made of undoped gallium nitride (GaN), through which carriers travel, and a 25-nm-thick carrier supplying layer 14 made of n-type aluminum gallium nitride (AlGaN) are successively grown, by MOVPE, on the principal surface of an insulative substrate 11, for example, made of sapphire. In this way, a Group III-V nitride semiconductor layer (hereinafter, referred to as "GaN-based semiconductor layer") 15 composed of the buffer layer 12, the channel layer 13 and the carrier supplying layer 14 is formed.

Next, a gate electrode 16 of a layered structure obtained by successively forming, for example, titanium (Ti) and gold (Au) in bottom-to-top order is selectively formed on a region of the GaN-based semiconductor layer 15 in which a HFET is to be formed (hereinafter, referred to as "HFET formation region") to be in Schottky contact with the GaN-based semiconductor layer 15.

Next, ohmic source and drain electrodes 17 and 18, for example, made of an alloy containing gold (Au), germanium (Ge) and nickel (Ni) are selectively formed on regions of the GaN-based semiconductor layer 15 located to both sides of the gate electrode 16, respectively. Thus, an HFET 19 composed of the GaN-based semiconductor layer 15, the gate electrode 16, the source electrode 17, and the drain electrode 18 is formed on the substrate 11. The HFET 19 operates in the following manner: A two-dimensional electron gas (2DEG) layer is formed at the heterojunction interface between the channel layer 13 and the carrier supplying layer 14, more specifically, in a region of the channel layer 13 located in the vicinity of the interface therebetween, and electrons travel at high speed while being confined in the 2DEG layer. The gate, source and drain electrodes 16, 17 and 18 can be formed by a so-called lift-off method in which a resist pattern is formed to expose regions in which the electrodes are to be formed, thereafter a metal film is deposited on the resist pattern by sputtering, vacuum metal evaporation or any other method and then the resist pattern is removed. The order in which the gate, source and drain electrodes 16, 17 and 18 are formed is not restrictive. However, it is preferable that the gate electrode 16 is formed earlier than the source and drain electrodes 17 and 18 for convenience in mask alignment.

Subsequently, a region of the GaN-based semiconductor layer 15 located around the HFET formation region is etched away with the HFET formation region masked. When in this case the GaN-based semiconductor layer 15 is dry-etched, a gas having, for example, chlorine ($Cl_2$) as the main ingredient is used as an etching gas. Thus, the side surfaces (ends) of the etched GaN-based semiconductor layer 15 are exposed. If an interconnect through which the HFET and a passive circuit (microstrip line) are connected to each other was formed with the side surfaces of the GaN-based semiconductor layer 15 exposed, the interconnect would come into contact with the side surfaces of the GaN-based semiconductor layer 15. Since the exposed side surfaces of the GaN-based semiconductor layer 15 include the side surfaces of the carrier supplying layer 14 having conductivity, it is undesirable that the interconnect through which an RF signal is transmitted comes in contact with the carrier supplying layer 14 serving as a conductive region of the GaN-based semiconductor layer 15. In other words, contact between the conductive region and the interconnect serving as a high-frequency transmission line causes a high-frequency loss and an impedance mismatch in the interconnect.

To cope with this, subsequently, in the first embodiment, a dielectric film 20, for example, made of silicon dioxide ($SiO_2$), benzocyclobutene (BCB), silicon nitride ($Si_3N_4$), or silicon oxynitride (SiON) is formed on the substrate 11 to cover the source and drain electrodes 17 and 18 and the top and side surfaces and upper corners of the GaN-based semiconductor layer 15. In this case, the dielectric film 20 preferably has a thickness of 0.5 μm through 3 μm both inclusive. Silicon oxide, silicon nitride or silicon oxynitride can be formed by chemical vapor deposition (CVD). Benzocyclobutene is a liquid, and thus spin coating is used to form a dielectric film 20 made of benzocyclobutene. Also when a liquid material, for example, SOG (spin on glass), is used in the formation of a dielectric film 20 made of silicon oxide, silicon nitride or silicon oxynitride, spin coating is preferably used.

By the way, this embodiment is based on the premise that when the GaN-based semiconductor layer 15 is formed in the form of islands (mesas), the sides of the GaN-based semiconductor layer 15 etched by dry etching are substantially vertical to the principal surface of the substrate 11. However, the island-like GaN-based semiconductor layer 15 can have a normally tapered form in which its upper part is smaller than its lower part under particular etching conditions. On condition that as described above the GaN-based semiconductor layer 15 is normally tapered, even if silicon oxide, silicon nitride or silicon oxynitride is used as a material of the dielectric film 20, a desired dielectric film 20 can be easily formed also by CVD or any other method without the need for necessarily using spin coating.

Figure 2A:
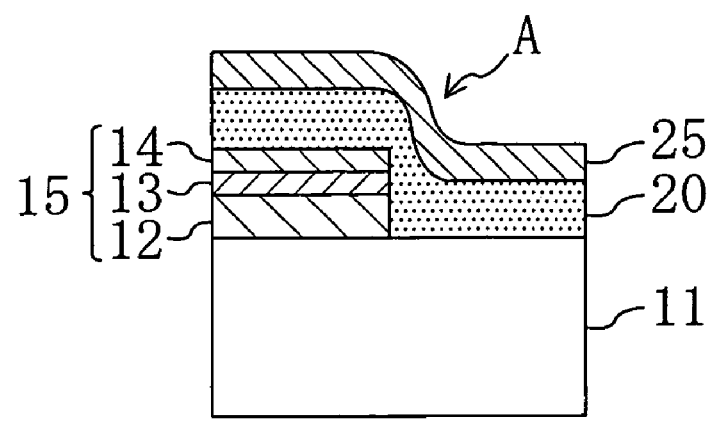
Figure 2B:
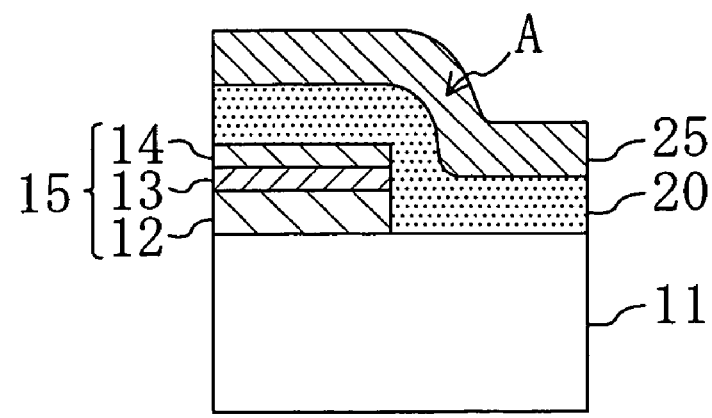

FIGS. 2A and 2B are enlarged views showing a part of the dielectric film 20 located in the vicinity of one of the upper corners (bends) of the GaN-based semiconductor layer 15. FIG. 2A shows the part of the dielectric film 20 when the dielectric film 20 is formed by CVD, and FIG. 2B shows the part of the dielectric film 20 when the dielectric film 20 is formed by spin coating. As shown in FIG. 2A, in the use of CVD, a part of the dielectric film 20 located on an upper corner A of the GaN-based semiconductor layer 15 is likely to be thinner than the other part thereof, leading to the reduced thickness of a part of an interconnect (drain lead) 25 formed on the part of the dielectric film 20 located on the corner A. As a result, the interconnect 25 may be partly removed at the corner A. Furthermore, since the thickness of the dielectric film 20 locally varies, this causes a deviation in impedance from a RF signal transmitted through the interconnect 25 and leads to leaked RF components. As a result, the transmission loss of the RF signal is increased. On the other hand, as shown in FIG. 2B, in the use of spin coating, the thickness of a part of the dielectric film 20 located in the vicinity of the upper corner A of the GaN-based semiconductor layer 15 is substantially equal to that of the other part thereof. This can prevent the interconnect 25 from being partly removed at the corner A and prevent the transmission loss of the RF signal.

Next, a first through hole 21 and a second through hole 22 are formed in parts of the formed dielectric film 20 located on the source and drain electrodes 17 and 18 to expose the source and drain electrodes 17 and 18. Furthermore, an approximately 100-μm-deep third through hole 23 is formed in a region of the dielectric film 20 located to the lateral side of the GaN-based semiconductor layer 15 closer to the source electrode 17. In this case, the depth of the third through hole 23 is made larger than a predetermined thickness of the substrate 11 that will be obtained by polishing the (back) surface of the substrate 11 opposed to the GaN-based semiconductor layer 15 in a later step. Etching or laser radiation using YAG laser light, carbon dioxide gas laser light or any other laser light is used to form the through holes 21, 22 and 23.

In this embodiment, it is preferable that out of the through holes 21, 22 and 23, the first and second through holes 21 and 22 and an upper part of the third through hole 23 are formed in the dielectric film 20 by etching and a part of the third through hole 23 located in the substrate 11 is formed by radiating YAG laser light or the like on the substrate 11.

The third through hole 23 is more easily formed from the surface of the substrate 11 on which the GaN-based semiconductor layer 15 is formed than from the back surface of the substrate 11. The reason for this is that when the third through hole 23 is to be formed from the back surface of the substrate 11, it is necessary to bond the surface thereof on which the GaN-based semiconductor layer 15 is formed to a quartz substrate, polish the back surface thereof to have a thickness of approximately 100 μm, and then form the third through hole 23 from the polished back surface of the substrate 11 by laser light or the like.

Next, a region of the dielectric film 20 except for the through holes 21, 22 and 23 and regions thereof in which interconnects, i.e., a source lead, a drain lead, a gate lead, and a microstrip line, are formed is masked using a resist film or any other film, and the inner walls of the through holes 21, 22 and 23 are metallized by gold plating or copper plating. In addition, a source lead 24, a drain lead 25, a microstrip line 25a, and a gate lead 26 are formed.

Subsequently, the back surface of the substrate 11 is polished such that the substrate 11 has a thickness of approximately 100 μm. Thereafter, an approximately 2-μm-thick conductive film 27 is formed on the polished back surface of the substrate 11. For example, the conductive film 27 made of tin (Sn) is formed by vacuum evaporation. Alternatively, the conductive film 27 made of gold (Au) is formed by gold plating.

As described above, according to a fabrication method for the semiconductor integrated circuit device of this embodiment, a GaN-based semiconductor layer 15 is patterned to form a HFET 19 serving as an active circuit, and then the side surfaces (ends) and upper corners of the GaN-based semiconductor layer 15 partly formed on a substrate 11 are covered with a dielectric film 20 made of silicon oxide, silicon nitride, benzocyclobutene, or any other material. With this structure, when the interconnects 24 and 25 are formed over the GaN-based semiconductor layer 15, parts of the dielectric film 20 formed on the upper corners of the GaN-based semiconductor layer 15 form gentle slopes. This can prevent the interconnects 24 and 25 from being partly removed at the bends of the GaN-based semiconductor layer 15.

Furthermore, since a microstrip line 25a is formed with the dielectric film 20 interposed between the microstrip line 25a and the substrate 11, this can provide excellent adhesion between the interconnect material and a front-end layer as compared with when the microstrip line 25a is formed directly on the substrate 11 made of sapphire.

In addition, since the dielectric film 20 made of silicon oxide, silicon nitride, silicon oxynitride, or benzocyclobutene has a lower permittivity than sapphire, a real substrate obtained by combining the substrate 11 with the dielectric film 20 has a lower effective permittivity than sapphire. This can increase the width of the microstrip line 25a serving as an RF transmission line to provide the same characteristic impedance. This can reduce the resistive components of the line, resulting in the reduced RF signal loss.

In the first embodiment, sapphire is used as a material of the insulative substrate 11. However, this is not restrictive. Silicon carbide, gallium nitride (GaN) or high-resistivity silicon (Si) can be used instead. These substrate materials have their merits and demerits. Therefore, a substrate material is preferably chosen according to its application and use conditions.

Sapphire substrates hold superiority over other substrates, such as SiC substrates and GaN substrates. The reason for this is that higher-quality and larger-diameter sapphire substrates, for example, 20.3-cm(=8-inch)-diameter substrates, have recently come on the market and sapphire substrates are supplied to the market with stability, leading to low cost. Sapphire substrates are useful as mounting substrates under microwaves or millimeter waves, because they have a small dielectric loss and a relative permeability of about 10. If an active circuit and a passive circuit can be integrated on a large-diameter substrate, the cost effectiveness can be improved.

Sapphire has lower thermal conductivity than SiC. Since high transmit power is not necessarily required for short-haul communications, sapphire substrates having low thermal conductivity are good enough to be used for short-haul communications using millimeter waves. Millimeter waves are fit for use in not long-haul communications but short-haul communications, because millimeter waves move more rectilinearly than microwaves and further are significantly absorbed by oxygen and moisture in the air. As seen from the above, sapphire substrates are suitable for reducing, by monolithic integration, the size and cost of RF front-end sections of short-haul communication systems or radar systems both using millimeter waves.

Sapphire has not only low thermal conductivity but also a relatively large lattice mismatch of 13% with a GaN-based semiconductor layer 15, for example, gallium nitride (GaN). This lattice mismatch can be reduced to some extent according to a material of a buffer layer 12 formed on a substrate 11 and growth conditions thereof. However, a material having an excellent lattice match, such as SiC or GaN, is preferably used instead of sapphire.

In this embodiment, a microstrip line 25a serving as a distributed-constant device is used for a passive circuit. However, this is not restrictive. The present invention can be applied also to spiral inductors serving as lumped-constant devices, because spiral inductors are each composed of two interconnects, i.e., a spiral interconnect layer and a lead layer.

Furthermore, the present invention is effective also when a part of an interconnect forms a resistor element.

Modification of Embodiment 1

A modification of the first embodiment of the present invention will be described hereinafter with reference to the drawings.

Figure 3A:
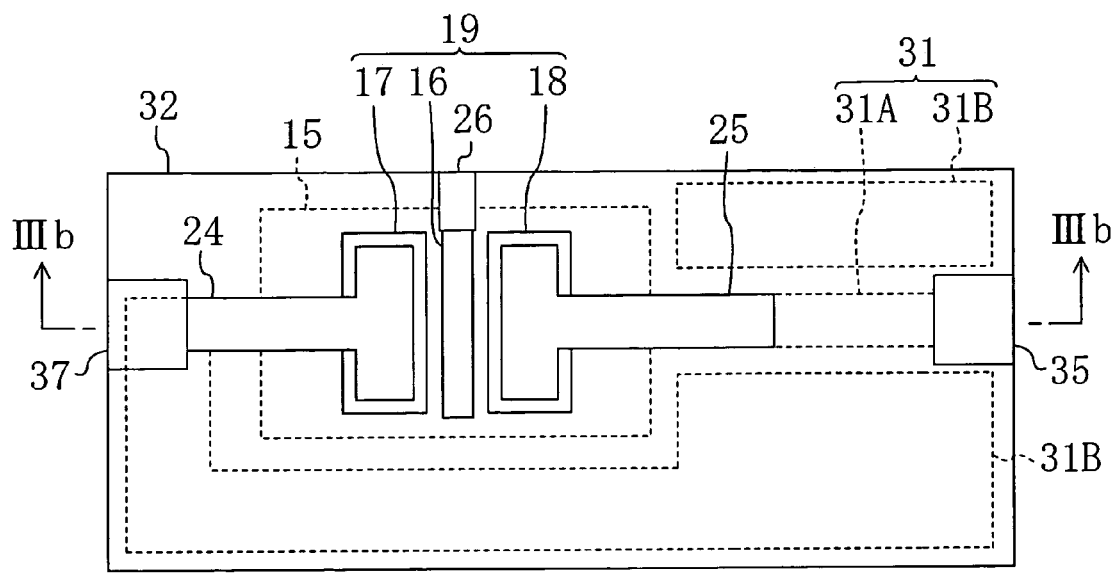
Figure 3B:
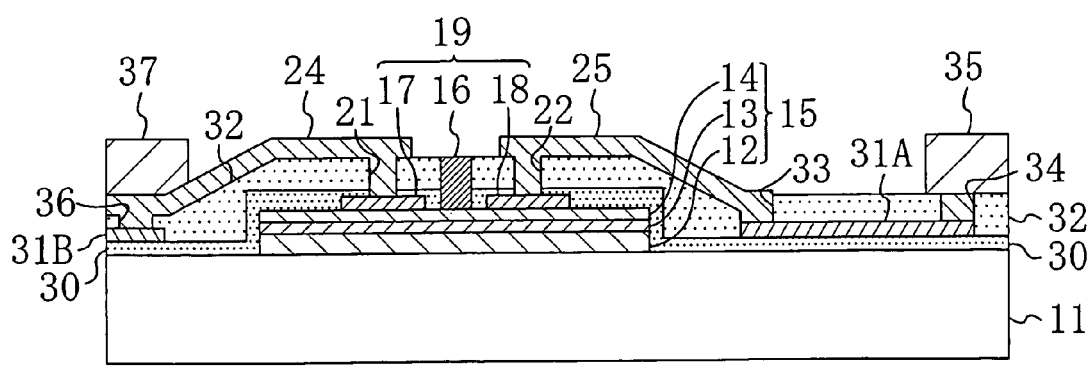

FIGS. 3A and 3D show a semiconductor integrated circuit device according to the modification of the first embodiment of the present invention. FIG. 3A is a plan view of a microwave or millimeter-wave MMIC including a GaN-based HFET serving as an active circuit and a coplanar stripline serving as a passive circuit. FIG. 3B is a cross-sectional view taken along the line IIIb-IIIb in FIG. 3A. In FIGS. 3A and 3B, the same reference numerals are given to the same components as those shown in FIGS. 1A and 1B, and a description of these components is not given. The coplanar stripline represents a RF transmission line in which a signal line and a ground line are formed on the same plane.

As shown in FIGS. 3A and 3B, a coplanar stripline 31 is formed on part of the principal surface of a substrate 11 of sapphire located closer to a drain electrode 18 of a HFET 19 with a first dielectric film 30 interposed between the substrate 11 and the coplanar stripline 31. The first dielectric film 30 is made of silicon oxide, silicon nitride, silicon oxynitride, or benzocyclobutene to have a thickness of about 2 μm.

The coplanar stripline 31 is composed of a signal line 31A of gold (Au) formed on the first dielectric film 30 and ground lines 31B of gold (Au) formed to both sides of the signal line 31A at intervals from the both sides thereof.

The coplanar stripline 31 is covered with a second dielectric film 32 made of silicon oxide, silicon nitride, silicon oxynitride, or benzocyclobutene. The signal line 31A of the coplanar stripline 31 is connected at one end to a drain lead 25 past a third through hole 33 formed in the second dielectric film 32 and at the other end to a first bump 35 with a fourth through hole 34 interposed between the signal line 31A and the first bump 35. When benzocyclobutene (BCB) is used for the first dielectric film 30, BCB is preferably used also for the second dielectric film 32. However, a material of the first dielectric film 30 does not necessarily need to be identical with that of the second dielectric film 32. In this modification, the drain lead 25 is connected at its end opposite to the coplanar stripline 31 with the drain electrode 18 to pass through a second through hole 22 formed in the first and second dielectric films 30 and 32.

A source lead 24 is formed on a part of the second dielectric film 32 and connected at one end to a source electrode 17 to pass through a first through hole 21 formed in the first and second dielectric films 30 and 32 and at the other end to one of the ground lines 31B to pass through a fifth through hole 36 formed in the second dielectric film 32.

As seen from the above, also in this modification, a GaN-based semiconductor layer 15 forming part of a HFET 19 is patterned on the substrate 11 in the form of islands like the first embodiment, and a passive circuit including a coplanar stripline 31 formed at a distance from the island-like GaN-based semiconductor layer 15 is formed on a first dielectric film 30 covering the HFET 19. Moreover, the coplanar stripline 31 has a lower effective permittivity even than the microstrip line 25a of the first embodiment.

Furthermore, since in this modification the second dielectric film 32 is formed on the first dielectric film 30, the influence of the upper corners of the GaN-based semiconductor layer 15 is weakened so that parts of the second dielectric film 32 formed immediately above the upper corners of the GaN-based semiconductor layer 15 form gentler slopes. As a result, source and drain leads 24 and 25 are less likely to be partly removed.

In this modification, instead of a so-called face-up-type packaging in which a conductive film 27 for applying the ground voltage to a passive circuit is formed on the back surface of a substrate 11 as in the first embodiment, a so-called flip-chip packaging in which first and second bumps 35 and 37 are opposed to a mounting substrate becomes possible. Wire bonding is unnecessary for the flip-chip packaging. Therefore, the use of flip-chip packaging can reduce the MMIC chip mounting area and also the high frequency loss caused by bonding wires.

A semiconductor integrated circuit device can have a structure using a coplanar stripline 31 while having a structure in which, as shown in FIG. 1A, a through hole 23 is formed to pass through a substrate 11 and a conductive film 27 is formed on the back surface of the substrate 11. This stripline is called a grounded coplanar stripline.

Embodiment 2

A second embodiment of the present invention will be described hereinafter with reference to the drawings.

Figure 4A:
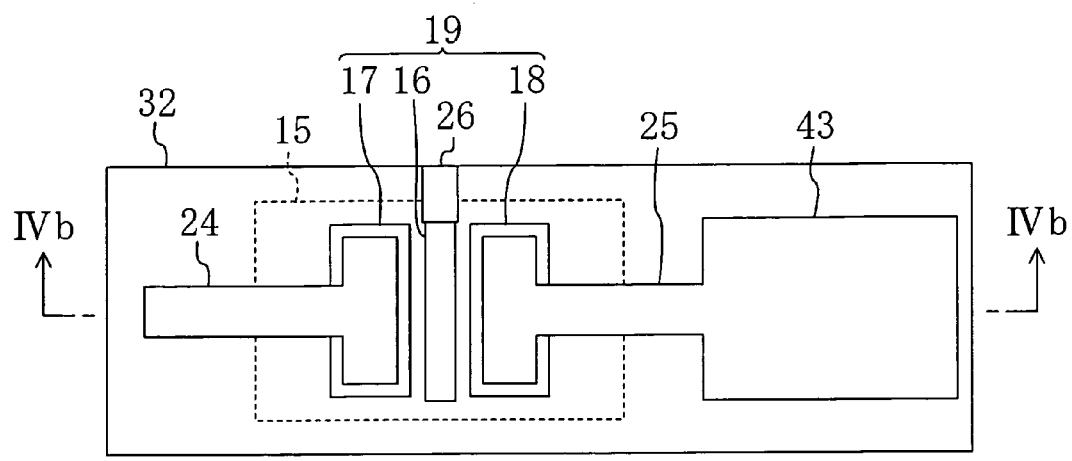
Figure 4B:
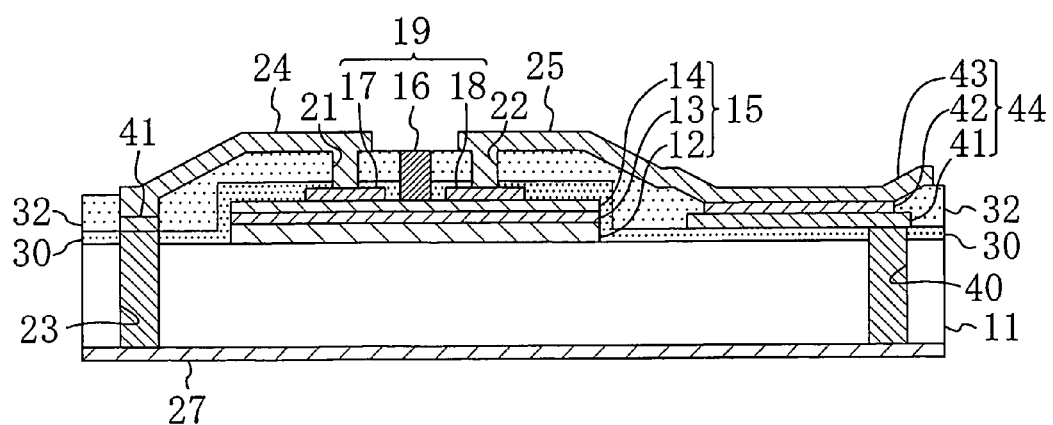

FIGS. 4A and 4B show a semiconductor integrated circuit device according to the second embodiment of the present invention. FIG. 4A is a plan view of a microwave or millimeter-wave MMIC including a GaN-based HFET serving as an active circuit and a MIM (metal-insulator-metal) capacitor serving as a passive circuit. FIG. 4B is a cross-sectional view taken along the line IVb-IVb in FIG. 4A. In FIGS. 4A and 4B, the same reference numerals are given to the same components as shown in FIGS. 1A, 1B, 3A, and 3B, and a description of these components is not given.

As shown in FIGS. 4A and 4B, a MIM capacitor 44 is formed on part of the principal surface of a substrate 11 of sapphire located closer to a drain electrode 18 of a HFET 19 with a first dielectric film 30 interposed between the substrate 11 and the MIM capacitor 44. The MIM capacitor 44 is composed of a lower electrode 41 formed on the first dielectric film 30 of silicon oxide, silicon nitride, silicon oxynitride, or benzocyclobutene and, for example, having a layered structure of titanium (Ti) and gold (Au), a capacitor insulating film 42 formed on the lower electrode 41 and, for example, made of silicon nitride, and an upper electrode 43 formed on the capacitor insulating film 42 and made of gold (Au).

The lower electrode 41 is connected to a conductive film 27 formed on the back surface of the substrate 11 through the metalized inner walls of a fourth through hole 40 formed in the substrate 11. The upper electrode 43 is formed continuously with a drain lead 25.

A formation method for the MIM capacitor 44 will be described hereinafter.

First, a gate electrode 16, a source electrode 17 and a drain electrode 18 are selectively formed on a GaN-based semiconductor layer 15. Thereafter, a region of the GaN-based semiconductor layer 15 expect for a region thereof forming part of a HFET 19 is patterned, and then a first dielectric film 30 made of silicon oxide, silicon nitride, silicon oxynitride, or benzocyclobutene is formed to cover the source and drain electrodes 17 and 18 and the GaN-based semiconductor layer 15. In this case, the first dielectric film 30 is preferably made of benzocyclobutene or the like and formed by spin coating as described in the first embodiment.

Next, as shown in FIG. 4B, a third through hole 23 is formed in a part of the substrate 11 located to the lateral side of the GaN-based semiconductor layer 15 closer to the source electrode 17, and a fourth through hole 40 is formed immediately below the lower electrode 41 of the MIM capacitor 44. Both of the through holes 23 and 40 are formed by etching or laser radiation.

Subsequently, the inner walls of the through holes 23 and 40 are metallized by gold plating or copper plating. Thereafter, titanium and gold are selectively deposited, by vacuum evaporation, in a region of the MIM capacitor 44 in which a lower electrode is to be formed, thereby forming a lower electrode 44.

Next, a second dielectric film 32 made of silicon oxide, silicon nitride, silicon oxynitride, or benzocyclobutene is formed on the first dielectric film 30. Also in this case, the second dielectric film 32 is preferably a film formed by spin coating. Subsequently, when the formed second dielectric film 32 is made of silicon oxide or benzocyclobutene, the top surface of the lower electrode 41 is exposed by etching away a part of the second dielectric film 32 located on the lower electrode 41. Then, silicon nitride of a predetermined thickness is deposited on the exposed part of the lower electrode by CVD or any other method to provide a capacitor insulating film 42. When a part of the second dielectric film 32 is left in the above etching to form a capacitor insulating film 42, a part of the second dielectric film 32 that will form a capacitor insulating film 42 need be selectively etched to form a capacitor insulating film 42 having a predetermined thickness and forming part of the second dielectric film 32.

Next, a source lead 24, a drain lead 25 and an upper electrode 43 continuous with the drain lead 25 are formed by gold plating.

As described above, according to a fabrication method for the semiconductor integrated circuit device of the second embodiment, a GaN-based semiconductor layer 15 is patterned to form a HFET 19 serving as an active circuit, and then the side surfaces (ends) and upper corners of the GaN-based semiconductor layer 15 formed on part of a substrate 11 are covered with a first dielectric film 30 made of silicon oxide, silicon nitride, benzocyclobutene, or any other material. With this structure, when the interconnects 24 and 25 are formed over the GaN-based semiconductor layer 15, parts of the first dielectric film 30 formed on the upper corners of the GaN-based semiconductor layer 15 form gentle slopes. This can prevent the interconnects 24 and 25 from being partly removed at the bends of the GaN-based semiconductor layer 15.

Furthermore, since in the second embodiment the second dielectric film 32 is formed on the first dielectric film 30, parts of the second dielectric film 32 formed immediately above the upper corners of the GIN-based semiconductor layer 15 form gentler slopes. As a result, the interconnects 24 and 25 are less likely to be partly removed.

Since the lower electrode 41 of the MIM capacitor 44 is formed not directly on the principal surface of the substrate 11 but with the first dielectric film 30 interposed between the lower electrode 41 and the substrate 11, the MIM capacitor 44 has a lower effective permittivity than when the MIM capacitor 44 is formed directly on the principal surface of the substrate 11. This can reduce the parasitic capacitance. As a result, the capacitance of the MIM capacitor 44 can be set as desired with high accuracy, and the transmission loss of a RF signal can be reduced.

When a material having a larger permittivity than a material of the second dielectric film 32 is used for a capacitor insulating film 42 forming a part of a MIM capacitor 44, this can reduce the size of the MIM capacitor 44 and the parasitic capacitance produced around the MIM capacitor 44. As a result, a semiconductor integrated circuit itself can be downscaled. This can achieve a higher-frequency operation.

Although also in the second embodiment sapphire is used for the insulative substrate 11, this is not restrictive. Silicon carbide (SiC), gallium nitride (GaN), or high-resistivity silicon can be used instead.

Embodiment 3

A third embodiment of the present invention will be described hereinafter with reference to the drawings.

As described in the background of the invention, a transistor or diode element using gallium nitride (GaN) having a relatively large band gap of 3.39 eV achieves a higher breakdown voltage, a higher-temperature operation, a higher resistance to a surge voltage, higher power handling, and lower distortion (lower intermodulation distortion) than that using gallium arsenic (GaAs). Furthermore, the on-resistance of the GaN-based transistor or diode element during the operation thereof is lower than that of the GaAs-based transistor or diode element, leading to low-noise characteristics.

In view of the above, GaN-based devices are suitable as basic devices forming RF front-end sections of radio communication systems or radar systems.

Figure 5:
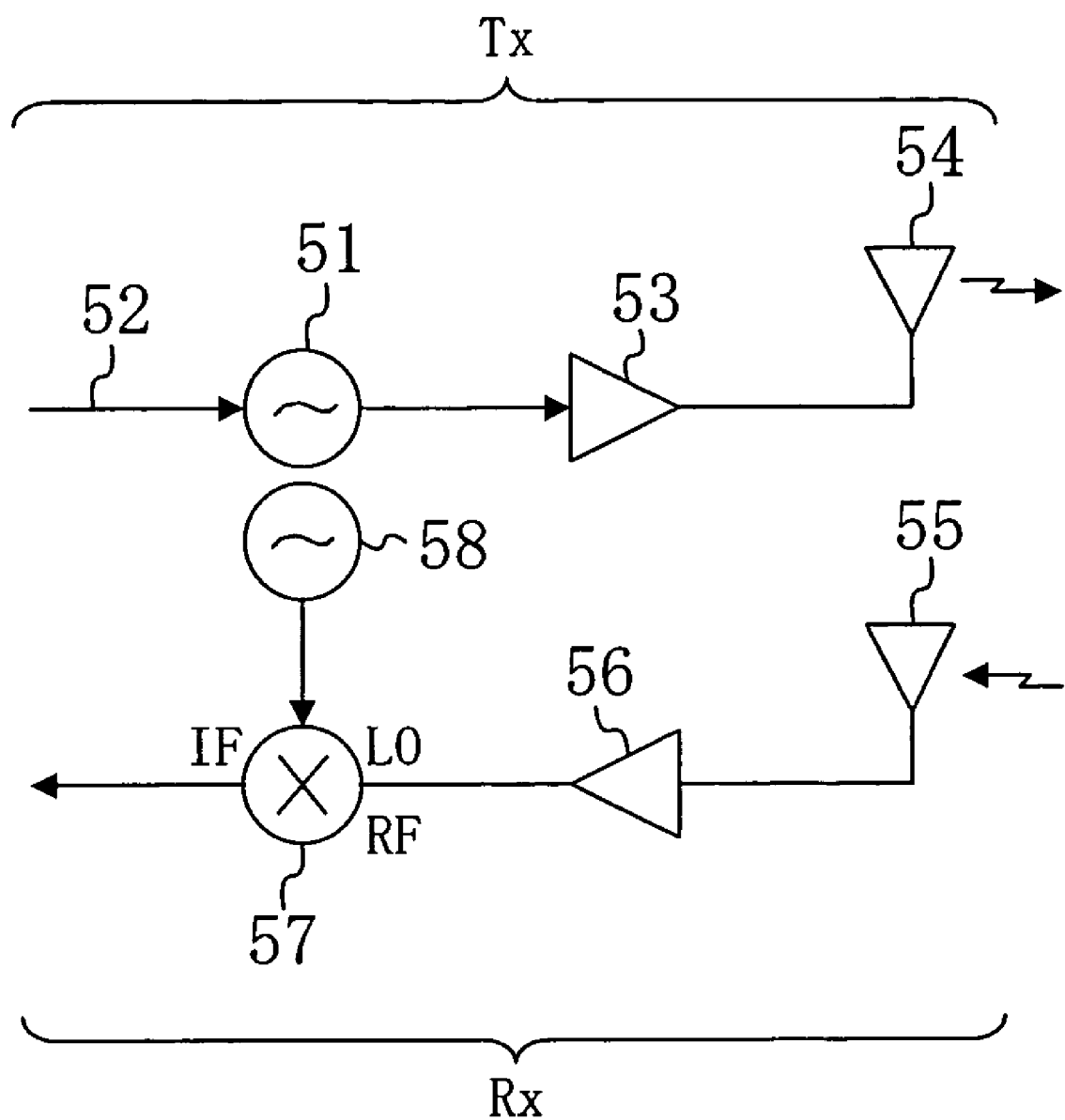
FIG. 5 is a block diagram showing a RF front-end section of a vehicle-mounted system using a pulse radar method according to a third embodiment of the present invention.

FIG. 5 is a block diagram showing an exemplary RF front-end section of a vehicle-mounted radar system using a pulse radar method according to the third embodiment of the present invention. As shown in FIG. 5, in a transmission circuit (Tx), a RF signal delivered from a first oscillator 51 is pulse-modulated by an externally input pulse signal 52, and the modulated RF signal is amplified by a power amplifier 53. Thereafter, the amplified signal is externally delivered from a transmission antenna 54. In a reception circuit (Rx), a reflected signal from an object (obstruction) to which the delivered RF signal is applied is received by a receiving antenna 55, and then the received signal is amplified by a low-noise amplifier 56. Thereafter, the amplified signal is frequency-converted using a signal delivered from a second oscillator 58 as a local signal by a down mixer 57. Subsequently, the frequency-converted signal is detected and the time difference between the frequency-converted signal and the pulse signal 52 fed to the transmission circuit (Tx) is measured, thereby measuring the distance between the vehicle-mounted radar system and the object.

Figure 6A:
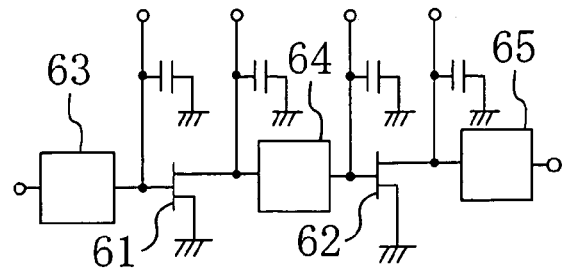
Figure 6B:
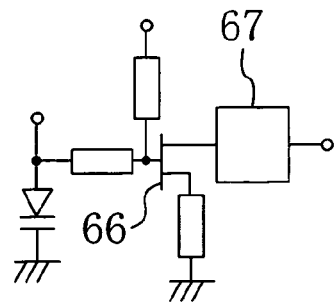
Figure 6C:
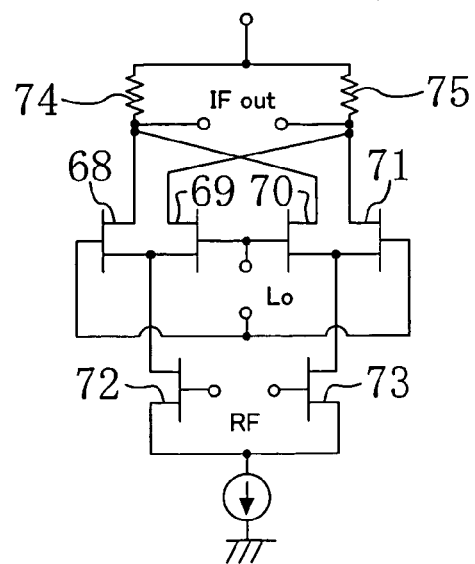
Figure 7:
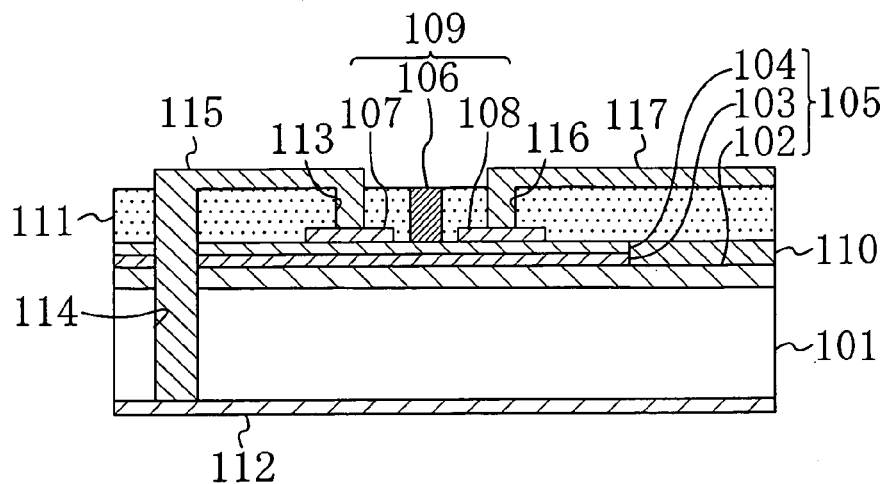
FIG. 7 is a cross-sectional view showing a semiconductor integrated circuit device (MMIC) according to a first known example.
Figure 8:
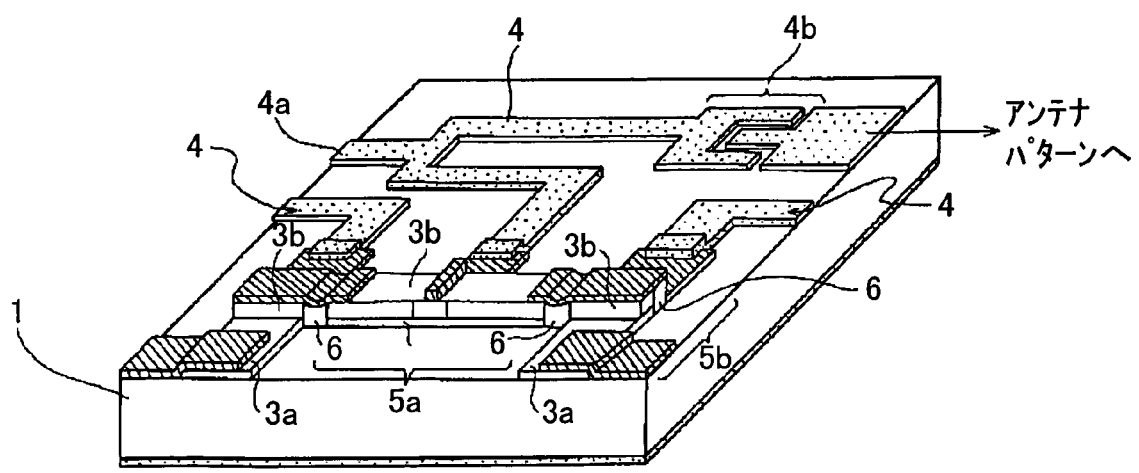
FIG. 8 is a perspective view showing a semiconductor integrated circuit device (MMIC) according to a second known example.

FIGS. 6A through 6C are diagrams showing equivalent circuits of a power amplifier and other devices using the MMIC of the present invention. FIG. 6A shows an equivalent circuit of a power amplifier 53 or a low-noise amplifier 56. A first MMIC shown in FIG. 6A includes a first GaN-based HFET 61 and a second GaN-based HFET 62. The first GaN-based HFET 61 is placed between an input matching circuit 63 and an inter-stage matching circuit 64, and the second GaN-based HFET 62 is placed between the inter-stage matching circuit 64 and an output matching circuit 65. FIG. 6B shows an equivalent circuit of a first oscillator 51 or a second oscillator 58. A second MMIC shown in FIG. 6B includes a GaN-based HFET 66 and an output matching circuit 67 located to the output side of the GaN-based HFET 66. FIG. 6C shows an equivalent circuit of a down mixer 57. A third MMIC shown in FIG. 6C includes first through sixth GaN-based HFETs 68 through 73 and resistor elements 74 and 75.

Vehicle-mounted radar systems require excellent-environmental-resistance devices that are not broken even under a surge voltage produced around or inside the vehicle and a high-temperature environment. Furthermore, since the vehicle-mounted radar system has radar characteristics in which an obstruction is sensed by receiving a reflected wave from the obstruction to which a transmission signal is applied, it receives signals of a wide range of power levels from a weak signal to a high-power signal. Therefore, a high dynamic range, i.e., the ability of processing signals having low-noise characteristics and low-distortion characteristics is demanded for devices used in high-frequency front-end sections of vehicle-mounted radar systems. GaN-based devices are the optimum devices that can satisfy such a demand.

In view of the above, according to the third embodiment, like the first MMIC shown in FIG. 6A, a microwave or millimeter-wave MMIC in which the GaN-based HFETs 61 and 62 and a passive circuit, such as the input matching circuit 63, are integrated forms a high-frequency front-end section. This can reduce the high-frequency loss, the chip area and the chip cost.

As described above, a semiconductor integrated circuit device according to the present invention in which an active circuit and a passive circuit are integrated can reduce the high-frequency loss and prevent an interconnect from being partly removed at the bend, while permitting reduction in the chip area, and are useful in a mobile communication system and a vehicle-mounted radar system used under microwaves or millimeter waves.

What is claimed is:

1. A semiconductor integrated circuit device comprising:
    an insulating substrate;
    an active circuit formed on part of the substrate and including a Group III-V nitride semiconductor layer, said Group III-V nitride semiconductor layer being formed directly on the substrate;
    a first dielectric film formed directly on the substrate to cover an upper corner of the Group III-V nitride semiconductor layer, said first dielectric film being formed directly on the Group III-V nitride semiconductor layer;
    a passive circuit formed with the first dielectric film between the substrate and the passive circuit; and
    a first interconnect through which the active circuit and the passive circuit are electrically connected to each other, said first interconnect being formed directly on the first dielectric film at the upper corner of the Group III-V nitride semiconductor layer.

2. The semiconductor integrated circuit device of claim 1, wherein
    the first dielectric film is a film formed by spin coating.

3. The semiconductor integrated circuit device of claim 2, wherein
    the film formed by spin coating is made of benzocyclobutene, silicon oxide, silicon nitride, or silicon oxynitride.

4. The semiconductor integrated circuit device of claim 1, wherein
    the first dielectric film is made of silicon oxide or silicon nitride.

5. The semiconductor integrated circuit device of claim 1 further comprising: a conductive film formed on the surface of the substrate opposite to the passive circuit; and
    a second interconnect through which the passive circuit and the conductive film are electrically connected to each other, said second interconnect being formed to pass through the substrate.

6. The semiconductor integrated circuit device of claim 1 further comprising a bump formed on part of the first dielectric film and electrically connected to the passive circuit.

7. The semiconductor integrated circuit device of claim 1, wherein the passive circuit is a capacitor, an inductor or a resistor element.

8. The semiconductor integrated circuit device of claim 1, wherein the passive circuit is a microstrip line or a coplanar stripline.

9. The semiconductor integrated circuit device of claim 1, wherein the substrate is made of sapphire, silicon carbide, gallium nitride, or high-resistivity silicon.

10. A vehicle-mounted radar system comprising an RF front-end section in which the semiconductor integrated circuit device of claim 1 is used.

11. A semiconductor integrated circuit device comprising:
    an insulating substrate;
    an active circuit fanned on part of the substrate and including a Group III-V nitride semiconductor layer, said Group III-V nitride semiconductor layer being formed directly on the substrate;
    a first dielectric film formed directly on the substrate to cover an upper corner of the Group III-V nitride semiconductor layer, said first dielectric film being formed directly on the Group III-V nitride semiconductor laver;
    a second dielectric film formed directly on the first dielectric film to cover the upper corner of the Group III-V nitride semiconductor layer;
    a passive circuit formed with the first dielectric film between the substrate and the passive circuit; and
    a first interconnect through which the active circuit and the passive circuit are electrically connected to each other, said first interconnect being formed directly on the first dielectric film at the upper corner of the Group III-V nitride semiconductor layer.

12. The semiconductor integrated circuit device of claim 11,
    wherein a material of the first dielectric film is different from a material of the second dielectric film.

13. The semiconductor integrated circuit device of claim 12,
    wherein the passive circuit is a capacitor, and
    a capacitor insulating film of the capacitor is a part of the second dielectric film.

14. The semiconductor integrated circuit device of claim 11,
    wherein the passive circuit is a capacitor, and a capacitor insulating film of the capacitor has a larger permittivity than the second dielectric film.

15. The semiconductor integrated circuit device of claim 12,
wherein at the upper corner of the Group III-V nitride semiconductor layer, the second dielectric film is inclined toward the substrate.

16. The semiconductor integrated circuit device of claim 11, further comprising a line of the passive circuit formed directly on the first dielectric film at a portion where the first dielectric film and the substrate contact, the line being connected to the first interconnect,
wherein the line is covered with the second dielectric film.

* * * * *